United States Patent
Shi

(10) Patent No.: US 10,946,418 B2
(45) Date of Patent: Mar. 16, 2021

(54) SCRUBBING DEVICE AND CLEANING EQUIPMENT

(71) Applicant: WUHAN CHINA STAR OPTOELECTRONICS TECHNOLOGY CO., LTD., Hubei (CN)

(72) Inventor: Jie Shi, Hubei (CN)

(73) Assignee: WUHAN CHINA STAR OPTOELECTRONICS TECHNOLOGY CO., LTD., Hubei (CN)

(*) Notice: Subject to any disclaimer, the term of this patent is extended or adjusted under 35 U.S.C. 154(b) by 240 days.

(21) Appl. No.: 16/301,891

(22) PCT Filed: Sep. 7, 2018

(86) PCT No.: PCT/CN2018/104482
§ 371 (c)(1),
(2) Date: Nov. 15, 2018

(87) PCT Pub. No.: WO2020/037720
PCT Pub. Date: Feb. 27, 2020

(65) Prior Publication Data
US 2019/0201937 A1 Jul. 4, 2019

(30) Foreign Application Priority Data

Aug. 21, 2018 (CN) .......................... 201810955766.3

(51) Int. Cl.
*B08B 1/04* (2006.01)
*H01L 21/67* (2006.01)
(Continued)

(52) U.S. Cl.
CPC ................ *B08B 1/04* (2013.01); *B08B 1/002* (2013.01); *F16J 15/3228* (2013.01);
(Continued)

(58) Field of Classification Search
CPC ............................ B08B 1/04; H01L 21/67046
(Continued)

(56) References Cited

U.S. PATENT DOCUMENTS 2,797,938 A * 7/1957 Reynolds ............. F16J 15/3224
277/561
2,857,184 A * 10/1958 Mancusi, Jr. ........ F16J 15/3204
277/468
(Continued)

FOREIGN PATENT DOCUMENTS

CN 1317655 A 10/2001
CN 2871036 Y 2/2007
(Continued)

*Primary Examiner* — Mark Spisich

(57) ABSTRACT

A scrubbing device is disclosed, and includes a body and a driving shaft, wherein the body is provided with a sealing mechanism configured to seal a connection portion between the driving shaft and the body. The sealing mechanism includes a sealing member sleeved on the driving shaft. The sealing member has an end that is attached, sealed, and connected to a sidewall of the body. The driving shaft is sleeved with a first sealing ring made of a rigid material and a second sealing ring made of a soft material. The first sealing ring and the second sealing ring are both in contact with an inner wall of the sealing member.

16 Claims, 4 Drawing Sheets

(51) Int. Cl.
  *F16J 15/3228*  (2016.01)
  *F16J 15/3252*  (2016.01)
  *A46B 13/00*   (2006.01)
  *A46B 13/02*   (2006.01)
  *B08B 1/00*    (2006.01)

(52) U.S. Cl.
  CPC .... F16J 15/3252 (2013.01); H01L 21/67046 (2013.01); *A46B 13/001* (2013.01); *A46B 13/02* (2013.01)

(58) Field of Classification Search
  USPC ......... 15/389, 391, 392, 21.1, 77, 88.3, 88.4
  See application file for complete search history.

(56) References Cited

U.S. PATENT DOCUMENTS

| | | | | |
|---|---|---|---|---|
| 3,795,931 A | * | 3/1974 | Martino | A46B 13/001 |
| | | | | 15/77 |
| 3,829,106 A | * | 8/1974 | Wheelock | F16J 15/3204 |
| | | | | 277/570 |
| 3,874,680 A | * | 4/1975 | Mustoe | F16J 15/3496 |
| | | | | 277/405 |
| 3,940,155 A | * | 2/1976 | Baumle | F16J 15/3236 |
| | | | | 277/558 |
| 6,439,578 B1 | | 8/2002 | *Radcliffe | |
| 2009/0146379 A1 | * | 6/2009 | Foster | F16J 15/3236 |
| | | | | 277/307 |
| 2009/0289418 A1 | * | 11/2009 | Cook | F16J 15/20 |
| | | | | 277/309 |
| 2013/0196572 A1 | * | 8/2013 | Ko | H01L 21/67751 |
| | | | | 451/11 |

FOREIGN PATENT DOCUMENTS

| | | |
|---|---|---|
| CN | 201627929 U | 11/2010 |
| CN | 202639876 U | 1/2013 |
| CN | 203566987 U | 4/2014 |
| CN | 104500746 A | 4/2015 |
| CN | 1105003651 A | 10/2015 |
| DE | 29622322 U1 | 3/1997 |
| KR | 20170079778 A | 7/2017 |

* cited by examiner

SCRUBBING DEVICE AND CLEANING EQUIPMENT

FIELD OF INVENTION

The present disclosure relates to the technical field of substrate cleaning, and specifically to scrubbing devices and cleaning equipment.

BACKGROUND OF INVENTION

In a preparation process of liquid crystal panels, it is necessary to clean a substrate using a cleaning device. In current cleaning equipment, a scrubbing device is generally provided for cleaning front and back surfaces of the substrate. Principle of the cleaning is that make tips of fluffs in contact with the surfaces of the substrate by rotation of a brush, thereby disturbing and scrubbing foreign matter on the surfaces of the substrate.

In the cleaning equipment, various chemical solutions are used in a cleaning environment, such as high-temperature and high-pressure. Therefore, sealing to avoid leakage is the most basic capability requirement of the cleaning equipment. But, in the scrubbing device, in order to keep a driving part of the brush dry, a driving shaft will extend outside a chamber. In the current scrubbing device, a connection portion between the driving shaft and a chamber body is generally sealed by bearings and rigid sealing members with double grooves.

However, the connection portion between the driving shaft and the body of the chamber sealed by the rigid structural design is poor against high-temperature and high-pressure chemical vapor, thereby easily causing leakage of the chemical vapor.

SUMMARY OF INVENTION

Technical Problem

A scrubbing device is provided in the present disclosure, which solve a problem that a technical problem that a sealing ability of an existing sealing mechanism is poor, and liquid chemical vapor is easily leaked.

Technical Solution

A scrubbing device, comprising:
a body;
a driving shaft horizontally disposed, wherein the driving shaft penetrates through the body;
a brush mounted on the driving shaft;
a sealing mechanism mounted on the body and configured to seal a connection portion between the driving shaft and the body;
wherein the sealing mechanism comprises a sealing member sleeved on the driving shaft, and the sealing member has an end that is attached, sealed, and connected to a sidewall of the body; wherein the driving shaft is sleeved with a first sealing ring made of a rigid material and a second sealing ring made of a soft material, and the first sealing ring and the second sealing ring are both in contact with an inner wall of the sealing member; wherein the first sealing ring is provided with a connection portion, the second sealing ring is provided with a sleeve portion sleeved on the connection portion, and an outer side of the sleeve portion is in contact with the inner wall of the sealing member; wherein the sealing member comprises a base and a sealing outer ring, the driving shaft sequentially passes through the base and the sealing outer ring, and the base is fixed on the body; and wherein a sealing membrane is disposed between the sealing outer ring and the base, one of two ends of the sealing membrane is fixedly connected to the base, and the other of the two ends of the sealing membrane is fixedly connected to the sealing outer ring.

Preferably, the first sealing ring and the second sealing ring are both disposed on an inner side of the sealing outer ring.

Preferably, the sealing outer ring is provided with a plurality of damping brackets, one of two ends of each of the damping brackets is fixedly connected to an outer side of the sealing outer ring, and the other of the two ends of each of the damping brackets is fixedly connected to the base.

Preferably, each of the damping brackets is fixedly connected to the base via a screw.

Preferably, the sealing membrane is made of a soft anticorrosive material.

Preferably, a protective casing is fixedly disposed on the base, and the sealing membrane is located inside the protective casing.

Preferably, the sealing mechanism is located inside of the body.

A scrubbing device includes:
a body;
a driving shaft horizontally disposed, wherein the driving shaft penetrates through the body;
a brush mounted on the driving shaft;
a sealing mechanism mounted on the body and configured to seal a connection between the driving shaft and the body; wherein the sealing mechanism comprises a sealing member sleeved on the driving shaft, and the sealing member has an end that is attached, sealed, and connected to a sidewall of the body; and wherein the driving shaft is sleeved with a first sealing ring made of a rigid material and a second sealing ring made of a soft material, and the first sealing ring and the second sealing ring are both in contact with an inner wall of the sealing member.

Preferably, the first sealing ring is provided with a connection portion, the second sealing ring is provided with a sleeve portion sleeved on the connection portion, and an outer side of the sleeve portion is in contact with the inner wall of the sealing member.

Preferably, the sealing member comprises a base and a sealing outer ring, the driving shaft sequentially passes through the base and the sealing outer ring, and the base is fixed on the body; and wherein a sealing membrane is disposed between the sealing outer ring and the base, one of two ends of the sealing membrane is fixedly connected to the base, and the other of the two ends of the sealing membrane is fixedly connected to the sealing outer ring.

Preferably, the first sealing ring and the second sealing ring are both disposed on an inner side of the sealing outer ring.

Preferably, the sealing outer ring is provided with a plurality of damping brackets, one of two ends of each of the damping brackets is fixedly connected to an outer side of the sealing outer ring, and the other of the two ends of each of the damping brackets is fixedly connected to the base.

Preferably, each of the damping brackets is fixedly connected to the base via a screw.

Preferably, the sealing membrane is made of a soft anticorrosive material.

Preferably, a protective casing is fixedly disposed on the base, and the sealing membrane is located inside the protective casing.

Preferably, the sealing mechanism is located inside of the body.

A cleaning equipment is further provided in the present disclosure, and includes a sprinkling device, a drying device and the above scrubbing device; wherein the sprinkling device is disposed over the driving shaft and is configured to clean a substrate in a sprinkling manner; and wherein the drying device is configured to dry the cleaned substrate.

A cleaning equipment is further provided in the present disclosure, and includes: a sprinkling device disposed over a driving shaft and configured to clean a substrate in a sprinkling manner;
a drying device configured to dry the cleaned substrate; and
a scrubbing device including:
a body;
a driving shaft horizontally disposed, wherein the driving shaft penetrates through the body;
a brush mounted on the driving shaft;
a sealing mechanism mounted on the body and configured to seal a connection between the driving shaft and the body; wherein the sealing mechanism comprises a sealing member sleeved-on the driving shaft, and the sealing member has an end that is attached, sealed, and connected to a sidewall of the body; and wherein the driving shaft is sleeved with a first sealing ring made of a rigid material and a second sealing ring made of a soft material, and the first sealing ring and the second sealing ring are both in contact with an inner wall of the sealing member.

Beneficial Effect

By a combination of the rigid first sealing ring and the soft second sealing ring cooperates on the driving shaft to provide a double protective sealing effect, while reinforcing connection tightness to the inner side of the sealing member and the outer side of the driving shaft by the soft second sealing ring to block high-temperature and high-pressure vapor and chemical resolution from advancing along the driving shaft, thereby preventing from leakage of the chemical resolution and the vapor in the body.

BRIEF DESCRIPTION OF DRAWINGS

In order to more clearly illustrate technical solutions in the present embodiments or the prior art, drawings used in a description of the embodiments or the prior art will be briefly described below. Obviously, the drawings in the following description are merely some embodiments of the present disclosure, and other drawings may be obtained from those skilled in the art without any creative work.

Figure 1:
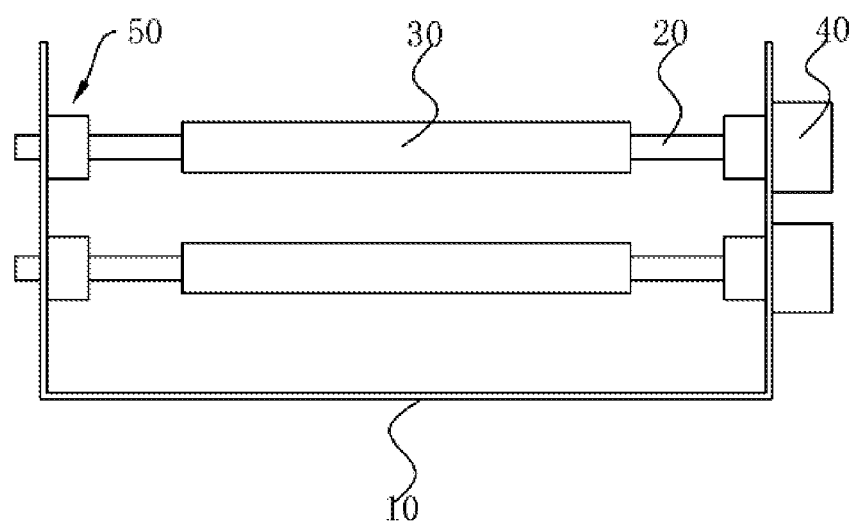
FIG. 1 is a schematic structural diagram of a scrubbing device in a specific embodiment of the present disclosure.

REFERENCE NUMERALS 10 body;
20 driving shaft;
30 brush;
40 motor;
50 sealing mechanism;
51 sealing member;
511 base;
512 sealing outer ring;
5121 clamping portion;
513 sealing membrane;
514 damping bracket;
515 protective casing;
52 first sealing ring;
521 connection portion;
53 second sealing ring;
531 sleeve portion;
54 bearing seal member;
55 screw;
60 sprinkling device;
70 drying device.

DETAILED DESCRIPTION OF PREFERRED EMBODIMENTS

The following description of each embodiment refers to the appended drawings for illustrating specific embodiments in which the present disclosure may be practiced. Directional terms as mentioned in the present disclosure, such as "up", "down", "front", "rear", "left", "right", "inside", "outside", "lateral", etc., are merely used for the purpose of illustrating and understanding the present disclosure and are not intended to be limiting of the present disclosure. In the drawings, units with similar structures are denoted by the same reference numerals.

The present disclosure is directed to an existing scrubbing device, which adopts a rigid structural design to seal a connection portion between a driving shaft 20 and a chamber body 10, and has a poor sealing performance against high-temperature and high-pressure of chemical vapor, thereby easily causing a technical problem of leakage of the vapor of the chemical resolution. The present embodiment may solve said defect.

As shown in FIG. 1, a scrubbing device includes a body 10, a driving shaft 20, a brush 30, a motor 40, and a sealing mechanism 50. The driving shaft 20 is horizontally mounted on the body 10 and is penetrating through the body 10. The brush 30 is fixed on the driving shaft 20 for scrubbing a substrate. The motor 40 is fixedly mounted on an outer side of the body 10 and is coupled to the driving shaft 20 in a transmission manner to drive the driving shaft 20 rotating. The sealing mechanism 50 is mounted on the body 10 and is configured to seal a connection portion between the driving shaft 20 and the body 10.

In FIG. 1, only two driving shaft 20 is shown. Understandably, in a specific embodiment, a single driving shaft 20 or more than two driving shafts 20 may be provided.

Figure 2:
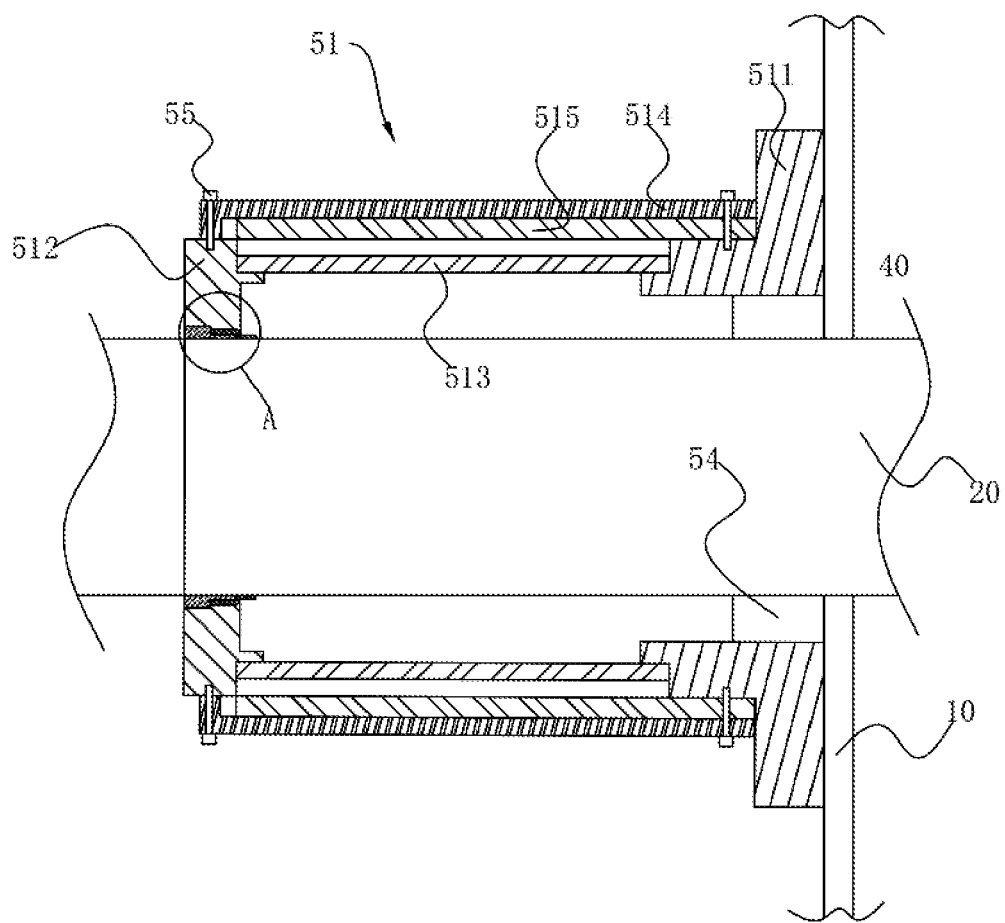
FIG. 2 is a schematic structural diagram of a sealing mechanism in a specific embodiment of the present disclosure.
Figure 3:
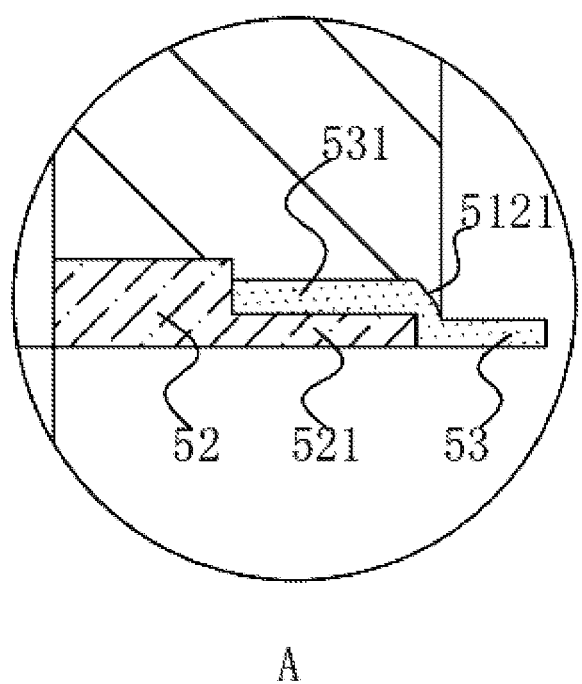
FIG. 3 is an enlarged view of a portion A in FIG. 2.

As shown in FIGS. 2 and 3, the sealing mechanism 50 includes a sealing member 51 that is sleeved on the driving shaft 20. The sealing member 51 has an end that is attached, sealed, and connected to a sidewall of the body 10. The driving shaft 20 is sleeved with a first sealing ring 52 made of a rigid material and a second sealing ring 53 made of a soft material. The first sealing ring 52 and the second sealing ring 53 are both in contact with an inner wall of the sealing member 51.

The rigid first sealing ring 52 and the soft second sealing ring 53 are combined to cooperate on the driving shaft 20 with the sealing member 51 to form a sealed environment. The soft material has a certain elasticity, so that connection tightness to an inner side of the sealing member 51 and an outer side of the driving shaft 20 is enhanced by the soft second sealing ring 53. The high-temperature and high-pressure vapor and the chemical solution are blocked from advancing along the driving shaft 20, thereby preventing from leakage of the chemical solution and the vapor in the body 10.

In the present preferred embodiment, the first sealing ring 52 is made of stainless steel (SUS), which has better abilities, such as corrosion resistance, high-temperature resistance, and wear resistance, to prevent the chemical solution in the body 10 from corroding the first sealing ring 52.

In the present preferred embodiment, the second sealing ring 53 is made of soft polypropylene (PP), which has better high-temperature resistance and wear resistance. Understandably, the second sealing ring 53 may also be selected from other materials, such as polyvinyl chloride (PVC) or polypropylene (PPE).

Specifically, the sealing member 51 includes a base 511 and a sealing outer ring 512, the driving shaft 20 sequentially passes through the base 511 and the sealing outer ring 512, and the base 511 is fixed on the body 10. In addition, A sealing membrane 513 is disposed between the sealing outer ring 512 and the base 511, one of two ends of the sealing membrane 513 is fixedly connected to the base 511, and the other of the two ends of the sealing membrane 513 is fixedly connected to the sealing outer ring 512, thereby forming a relatively sealed space.

The first sealing ring 52 and the second sealing ring 53 are both disposed on an inner side of the sealing outer ring 512.

As shown in FIG. 2, the sealing outer ring 512 is provided with a plurality of damping brackets 514, one of two ends of each of the damping brackets 514 is fixedly connected to an outer side of the sealing outer ring 512, and the other of the two ends of each of the damping brackets 514 is fixedly connected to the base 511. As a usage time of the scrubbing device increases, a certain vibration occurs when the driving shaft 20 rotates. The sealing outer ring 512 and the base 511 are connected by the sealing membrane 513 and the damping brackets, thereby ensuring that the sealing outer ring 512 vibrates with the driving shaft 20 together. The sealing outer ring 512 and the driving shaft 20 are closely fitted to reduce the hard wear between the seal outer ring 512 and the driving shaft 20, such that improves the service life of the driving shaft 20 and the seal outer ring 512, and prevents from leakage of the chemical solution and the vapor in the body 10 after the seal outer ring 512 and the driving shaft 20 are worn.

Specifically, each of the damping brackets 514 is fixedly connected to the base 511 via a screw 55, wherein a protective casing 515 is located between the damping brackets 514 and a sidewall of the base 511, the screw 55 sequentially passes through one of the damping brackets 514 and the protective casing 515. The screw 55 is connected to the base 511 and the damper brackets 514 in a screwed manner. The damper brackets 514 are fixedly connected to the base 511 by the screw 55, so that the damper bracket 514 and the sealing outer ring 512 have a certain amplitude range of longitudinal sway, which may effectively buffer and cancel the effect of shock caused by the driving shaft 20 to the sealing outer ring 512.

It should be noted that, in the present preferred embodiment, each of the damper brackets 514 and the sealing outer ring 512 are connected via another screw 55 to facilitate loading and unloading of the damper bracket 514. Understandably, in a specific embodiment, the damper bracket 514 may also be fixedly connected with the sealing outer ring 512 by other means, such as welding or integral forming.

In the present preferred embodiment, a number of the damper bracket 514 is two, which are symmetrically disposed with respect to an axis of the sealing outer ring 512, such that prevents the sealing outer ring 512 from being separated from the base 511, while the damper bracket 514 and the sealing outer ring 512 have the certain amplitude range of longitudinal sway.

The sealing membrane 513 is made of a soft anticorrosive material. In the present preferred embodiment, the sealing membrane 513 is made of PP, which may prevent from the sealing membrane 513 corroded by the chemical solution in the body 10. Simultaneously, transmission of vibration between the base 511 and the sealing outer ring 512 is prevented by the soft sealing film 513 to reduce abrasion between the base 511 and the sealing outer ring 512.

The protective casing 515 is fixedly disposed on the base 511, and the sealing membrane 513 is located inside the protective casing 515. The sealing membrane 513 is protected by the protective casing 515 to prevent the chemical solution and the high-temperature vapor from leaking after the sealing membrane 513 is broken.

The sealing mechanism 50 is located at an inner side of the body 10. The base 511 is fixedly mounted on an inner wall of the body 10, the sealing outer ring 512 is located at the left side of the base 511. The chemical solution and the high-temperature vapor are blocked from entering a cavity between the sealing outer ring 512 and the base 511 along the driving shaft 20 by the first sealing ring 52 and the second sealing ring 53 in the sealing outer ring 512, thereby preventing the chemical solution and the high-temperature vapor from corroding the inside of the sealing membrane 513. Thus, it may improve service life of the sealing membrane 513.

The inner side of the base 511 is provided with a bearing seal member 54, which is sleeved on the driving shaft 20. A better sealing effect is achieved by cooperating the first sealing ring 52, the second sealing ring 53, and the bearing seal member 54 on the driving shaft 20.

As shown in FIG. 3, the first sealing ring 52 is provided with a connection portion 521, the second sealing ring 53 is provided with a sleeve portion 531 sleeved on the connection portion 521, and an outer side of the sleeve portion 531 is in contact with the inner wall of the sealing member 51. The second sealing ring 53 is sleeved on an outer side of the first sealing ring 52 via the sleeve portion 531. Therefore, the first sealing ring 52 and the second sealing ring 53 are more closely connected, and leakage of the chemical solution and the high-temperature vapor is prevented from leakage after a gap is generated at the connection portion between the first seal ring 52 and the second seal ring 53.

An inner edge of the right end of the sealing outer ring 512 is bent inwardly to form a clamping portion 5121, the sleeve portion 531 of the second sealing ring 53 is clamped at the clamping portion 5121. Thereby, a clamped-embedded installation of the second sealing ring 53 is implemented, such that the second sealing ring 53 and the inner side of the sealing outer ring 512 are more closely attached, and it facilitates to a replacement of the second sealing ring 53.

The first sealing ring 52 is located at one end of the second sealing ring 53 away from the base 511. The first sealing ring 52 has better abilities, such as corrosion resistance, high-temperature resistance, and wear resistance. The high-temperature vapor is blocked from contacting the second sealing ring 53 by the first sealing ring 52, thereby preventing the second sealing ring 53 from being corroded and increasing service life of the second sealing ring 53. Simultaneously, the second sealing ring 53 can serve as a second protection. When a gap is formed between the first sealing ring 52 and the driving shaft 20 due to wear or the like, the second sealing ring 53 may prevent the chemical solution and the high-temperature vapor from leaking through the gap.

Figure 4:
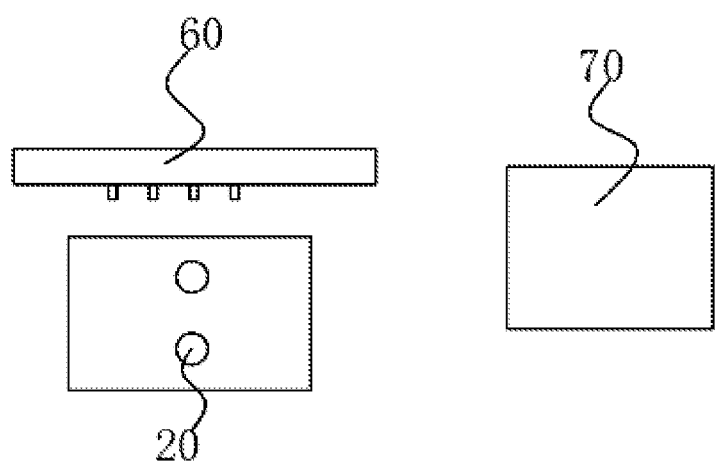
FIG. 4 is a schematic structural diagram of a cleaning apparatus in a specific embodiment of the present disclosure.

As shown in FIG. 4, a cleaning equipment includes a sprinkling device 60, a drying device 70, and the above scrubbing device; wherein the sprinkling device 60 is disposed over the driving shaft 20 and configured to clean a substrate in a sprinkling manner; and the drying device 70 is configured to dry the cleaned substrate.

Beneficial effect of the present disclosure is that, by a combination of the rigid first sealing ring 52 and the soft second sealing ring 53 cooperates on the driving shaft 20 to provide a double protective sealing effect while reinforcing connection tightness to the inner side of the sealing member 51 and the outer side of the driving shaft 20 by the soft second sealing ring 53 to block the high-temperature and high-pressure vapor and the chemical resolution from advancing along the driving shaft 20, thereby preventing from leakage of the chemical resolution and the vapor in the body 10.

What is claimed is:

1. A scrubbing device, comprising:
a body;
a driving shaft horizontally disposed, wherein the driving shaft penetrates through the body;
a brush mounted on the driving shaft;
a sealing mechanism mounted on the body and configured to seal a connection portion between the driving shaft and the body;
wherein the sealing mechanism comprises a sealing member sleeved on the driving shaft, and the sealing member has an end that is attached, sealed, and connected to a sidewall of the body; wherein the driving shaft is sleeved with a first sealing ring made of a rigid material and a second sealing ring made of a soft material, and the first sealing ring and the second sealing ring are both in contact with an inner wall of the sealing member; wherein the first sealing ring is provided with a connection portion, the second sealing ring is provided with a sleeve portion sleeved on the connection portion, and an outer side of the sleeve portion is in contact with the inner wall of the sealing member; wherein the sealing member comprises a base and a sealing outer ring, the driving shaft sequentially passes through the base and the sealing outer ring, and the base is fixed on the body; and wherein a sealing membrane is disposed between the sealing outer ring and the base, one of two ends of the sealing membrane is fixedly connected to the base, and the other of the two ends of the sealing membrane is fixedly connected to the sealing outer ring.

2. The scrubbing device as claimed in claim 1, wherein the first sealing ring and the second sealing ring are both disposed on an inner side of the sealing outer ring.

3. The scrubbing device as claimed in claim 2, wherein the sealing outer ring is provided with a plurality of damping brackets, one of two ends of each of the damping brackets is fixedly connected to an outer side of the sealing outer ring, and the other of the two ends of each of the damping brackets is fixedly connected to the base.

4. The scrubbing device as claimed in claim 3, wherein each of the damping brackets is fixedly connected to the base via a screw.

5. The scrubbing device as claimed in claim 3, wherein the sealing membrane is made of a soft anticorrosive material.

6. The scrubbing device as claimed in claim 2, wherein the sealing mechanism is located inside of the body.

7. The scrubbing device as claimed in claim 1, wherein a protective casing is fixedly disposed on the base, and the sealing membrane is located inside the protective casing.

8. A scrubbing device, comprising:
a body;
a driving shaft horizontally disposed, wherein the driving shaft penetrates through the body;
a brush mounted on the driving shaft; and
a sealing mechanism mounted on the body and configured to seal a connection between the driving shaft and the body;
wherein the sealing mechanism comprises a sealing member sleeved on the driving shaft, and the sealing member has an end that is attached, sealed, and connected to a sidewall of the body; wherein the driving shaft is sleeved with a first sealing ring made of a rigid material and a second sealing ring made of a soft material, and the first sealing ring and the second sealing ring are both in contact with an inner wall of the sealing member; and wherein the first sealing ring is provided with a connection portion, the second sealing ring is provided with a sleeve portion sleeved on the connection portion, and an outer side of the sleeve portion is in contact with the inner wall of the sealing member.

9. The scrubbing device as claimed in claim 8, wherein the sealing member comprises a base and a sealing outer ring, the driving shaft sequentially passes through the base and the sealing outer ring, and the base is fixed on the body; and wherein a sealing membrane is disposed between the sealing outer ring and the base, one of two ends of the sealing membrane is fixedly connected to the base, and the other of the two ends of the sealing membrane is fixedly connected to the sealing outer ring.

10. The scrubbing device as claimed in claim 9, wherein the first sealing ring and the second sealing ring are both disposed on an inner side of the sealing outer ring.

11. The scrubbing device as claimed in claim 10, wherein the sealing outer ring is provided with a plurality of damping brackets, one of two ends of each of the damping brackets is fixedly connected to an outer side of the sealing outer ring, and the other of the two ends of each of the damping brackets is fixedly connected to the base.

12. The scrubbing device as claimed in claim 11, wherein each of the damping brackets is fixedly connected to the base via a screw.

13. The scrubbing device as claimed in claim 11, wherein the sealing membrane is made of a soft anticorrosive material.

14. The scrubbing device as claimed in claim 10, wherein the sealing mechanism is located inside of the body.

15. The scrubbing device as claimed in claim 9, wherein a protective casing is fixedly disposed on the base, and the sealing membrane is located inside the protective casing.

16. A cleaning equipment, comprising:
a sprinkling device disposed over a driving shaft and configured to clean a substrate in a sprinkling manner;
a drying device configured to dry the cleaned substrate; and
a scrubbing device comprising:
the driving shaft being horizontally disposed, wherein the driving shaft penetrates through the body;
a brush mounted on the driving shaft;
a sealing mechanism mounted on the body and configured to seal a connection between the driving shaft and the body;
wherein the sealing mechanism comprises a sealing member sleeved on the driving shaft, and the sealing member has an end that is attached, sealed, and connected to a sidewall of the body; wherein the driving shaft is sleeved with a first sealing ring made of a rigid material and a second sealing ring made of a soft material, and the first sealing ring and the second sealing ring are both in contact with an inner wall of the sealing member; and wherein the first sealing ring is provided with a connection portion, the second sealing ring is provided with a sleeve portion sleeved on the connection portion, and an outer side of the sleeve portion is in contact with the inner wall of the sealing member.

* * * * *